(12) United States Patent
Weis

(10) Patent No.: US 11,398,334 B2
(45) Date of Patent: Jul. 26, 2022

(54) COMPONENT CARRIER COMPRISING EMBEDDED INDUCTOR WITH AN INLAY

(71) Applicant: AT&S Austria Technologie & Systemtechnik Aktiengesellschaft, Leoben (AT)

(72) Inventor: Gerald Weis, St. Marein im Mürztal (AT)

(73) Assignee: AT&S Austria Technologie & Systemtechnik Aktiengesellschaft, Leoben (AT)

(*) Notice: Subject to any disclaimer, the term of this patent is extended or adjusted under 35 U.S.C. 154(b) by 67 days.

(21) Appl. No.: 16/048,663

(22) Filed: Jul. 30, 2018

(65) Prior Publication Data
US 2020/0035396 A1     Jan. 30, 2020

(51) Int. Cl.
| | |
|---|---|
| H01F 5/00 | (2006.01) |
| H01F 27/02 | (2006.01) |
| H01F 27/24 | (2006.01) |
| H01F 27/28 | (2006.01) |
| H01F 41/02 | (2006.01) |
| H01F 41/04 | (2006.01) |
| H05K 1/16 | (2006.01) |

(52) U.S. Cl.
CPC .......... *H01F 27/022* (2013.01); *H01F 27/24* (2013.01); *H01F 27/2804* (2013.01); *H01F 41/0206* (2013.01); *H01F 41/041* (2013.01); *H05K 1/165* (2013.01); *H01F 2027/2809* (2013.01)

(58) Field of Classification Search
USPC ....................................................... 336/200
See application file for complete search history.

(56) References Cited

U.S. PATENT DOCUMENTS

| | | | | |
|---|---|---|---|---|
| 5,267,107 A | * | 11/1993 | Vadnais et al. | ........... G11B 5/60 360/109 |
| 5,349,743 A | * | 9/1994 | Grader et al. | ........... H01F 41/02 336/200 |
| 5,479,695 A | * | 1/1996 | Grader et al. | ........... H01F 41/02 336/200 |
| 5,990,776 A | | 11/1999 | Jitaru | |

(Continued)

FOREIGN PATENT DOCUMENTS

| | | |
|---|---|---|
| CN | 107256757 A | 6/2017 |
| DE | 102016203613 A1 | 9/2017 |
| EP | 2 107 577 A1 | 10/2009 |

(Continued)

OTHER PUBLICATIONS

English translation of JP60189915 (Year: 1985).*

(Continued)

*Primary Examiner* — Ronald Hinson
(74) *Attorney, Agent, or Firm* — Robert A. Blaha; Smith Tempel Blaha LLC

(57) ABSTRACT

A component carrier which includes a stack with at least one electrically conductive layer structure and/or at least one electrically insulating layer structure, and an inductor arranged at least partially in the stack is disclosed. The inductor includes an electrically conductive coil structure, wound around a coil opening, and a magnetic core. At least part of the magnetic core at least partially fills the coil opening. At least part of at least one of the coil structure and the magnetic core is configured as an inlay embedded in the stack.

13 Claims, 3 Drawing Sheets

(56) References Cited

U.S. PATENT DOCUMENTS

| | | | |
|---|---|---|---|
| 7,318,269 B2* | 1/2008 | Yoshida | G11B 5/1274 |
| | | | 29/602.1 |
| 8,410,576 B2* | 4/2013 | Smeys et al. | H01F 257/528 |
| | | | 336/200 |
| 10,141,107 B2* | 11/2018 | Lee et al. | H01F 27/2804 |
| | | | 336/200 |
| 2008/0078474 A1* | 4/2008 | Naito | C22C 33/0228 |
| | | | 148/304 |
| 2009/0237899 A1 | 9/2009 | Furnival | |
| 2010/0171582 A1 | 7/2010 | Matz | |
| 2013/0009356 A1* | 4/2013 | Moiseev | H01F 27/24 |
| | | | 336/221 |
| 2013/0093561 A1 | 4/2013 | Moiseev | |
| 2013/0335937 A1* | 12/2013 | Askari | H01L 25/00 |
| | | | 361/764 |
| 2014/0266550 A1 | 9/2014 | Turnbull et al. | |
| 2015/0101854 A1 | 4/2015 | Lee et al. | |
| 2016/0284462 A1 | 9/2016 | Ahn | |
| 2018/0076704 A1 | 3/2018 | Kneller et al. | |

FOREIGN PATENT DOCUMENTS

| | | |
|---|---|---|
| EP | 2825005 B1 | 12/2016 |
| EP | 3 340 260 A1 | 6/2018 |

OTHER PUBLICATIONS

Extended European Search Report in Application No. 19188903.9 dated Oct. 18, 2019; pp. 1-10; European Patent Office, 80298, Munich, Germany.

Knowles, John E., The Origin of the Increase in Magnetic Loss Induced by Machining Ferrites, IEEE Transactions on Magnetics, vol. Mag-11, No. 1, Jan. 1975, pp. 44-50.

Weiser, W.; Communication Pursuant to Article 94(3) EPC; Application No. 19 188 903.9; pp. 1-10; Nov. 17, 2020; European Patent Office; 80298, Munich, Germany.

* cited by examiner

COMPONENT CARRIER COMPRISING EMBEDDED INDUCTOR WITH AN INLAY

TECHNICAL FIELD

The invention relates to a component carrier, a method of manufacturing a component carrier, and to an electronic device.

BACKGROUND

In the context of growing product functionalities of component carriers equipped with one or more electronic components and increasing miniaturization of such components as well as a rising number of components to be connected to the component carriers such as printed circuit boards, increasingly more powerful array-like components or packages having several components are being employed, which have a plurality of contacts or connections, with ever smaller spacing between these contacts. In particular, component carriers shall be mechanically robust and electrically reliable so as to be operable even under harsh conditions.

In particular, efficiently connecting components to a component carrier is an issue. This applies in particular to component carriers to which an inductor shall be connected.

SUMMARY

There may be a need to efficiently connect an inductor to a component carrier.

According to an exemplary embodiment of the invention, a component carrier is provided which comprises a stack comprising at least one electrically conductive layer structure and/or at least one electrically insulating layer structure, and an inductor arranged at least partially in the stack and comprising an electrically conductive coil structure, wound around a coil opening, and a magnetic core, wherein at least part of the magnetic core at least partially fills the coil opening, wherein at least part (in particular only part) of at least one of the coil structure and the magnetic core is configured as an inlay embedded in the stack.

According to another exemplary embodiment of the invention, an electric device is provided, wherein the electric device comprises a support body (for example a printed circuit board), and a component carrier having the above-mentioned features and mounted on and/or in the support body.

According to still another exemplary embodiment of the invention, a method of manufacturing a component carrier is provided, wherein the method comprises providing a stack comprising at least one electrically conductive layer structure and/or at least one electrically insulating layer structure, arranging an inductor at least partially in the stack, forming the inductor with an electrically conductive coil structure wound around a coil opening and with a magnetic core, wherein at least part of the magnetic core at least partially fills the coil opening, and embedding at least part (in particular only part) of at least one of the coil structure and the magnetic core as an inlay in the stack.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

In the context of the present application, the term "inductor" may particularly denote a passive (in particular two-terminal, for instance inductance, or four-terminal, for instance transformer) electrical component that is capable of storing energy in a magnetic field when electric current flows through the inductor. An inductor may comprise an electrically conductive wiring wound into a coil shape around a magnetic core.

In the context of the present application, the term "coil structure" may particularly denote an at least partially electrically conductive structure, which may be composed of one or multiple connected electrically conductive elements, defining one or multiple windings. The windings may have a circular shape, a rectangular shape, any other polygonal shape, etc.

In the context of the present application, the term "coil opening" may particularly denote a through hole extending through an interior of one or more windings of the coil structure.

In the context of the present application, the term "magnetic core" may particularly denote a body of magnetic material, which body may be composed of one or multiple connected or spaced magnetic elements. The magnetic core may increase the magnetic field and thus the inductance of the inductor. For example, such a magnetic core may comprise or consist of iron and/or ferrite.

In the context of the present application, the term "inlay" may particularly denote a pre-manufactured member which can be inserted into a cavity of the stack of layer structures as a whole. Thus, the inlay can be manufactured in accordance with the requirements of its function, independently of boundary conditions of component carrier manufacturing technology.

According to an exemplary embodiment of the invention, a component carrier is provided which has at least one embedded inductor composed of a magnetic core and a coil structure within which the magnetic core is at least partially arranged. Highly advantageously, one or both of coil structure and magnetic core may be at least partially embodied as a pre-manufactured inlay to be inserted as a whole in a respective cavity of a layer stack of component carrier material (in particular printed circuit board material). By taking this measure, the one or more inlays, forming inductor constituents, may be pre-manufactured independently of any limitations (for instance in terms of materials supported by a PCB process, thermal stability, etc.) related to component carrier manufacturing technology. Advantageously, such one or more inlays may be inserted in any free region of the component carrier so that a component carrier designer has a high flexibility and freedom of designing the embedded inductor. This results from the fact that the inductor can have nearly every shape, and the freedom of shape is high when the inductor is embedded in a component carrier. Moreover, relatively high inductance values may be achieved by the described manufacturing technology. Furthermore, this manufacturing architecture allows for a high integration density, in particular for applications such as power electronic converters (for instance DC/DC converters, DC/AC converters). Beyond this, the manufacturing process is also compatible with the formation of coupled inductors, i.e. multiple inductors in functional relationship within a common component carrier. For example, this also allows manufacturing PCB transformers with complex shapes. Also power electronic modules can be manufactured with this technology. The inductivity of the embedded inductor in the component carrier is freely and accurately adjustable.

What concerns the electric device, it is advantageously possible to use the described component carrier with embedded inductor as a component which can be mounted on or in a support body such as another component carrier. In other words and more specifically, the finished component carrier with embedded inductor can be used itself as surface mounted device (SMD) or as an embedded component.

In the following, further exemplary embodiments of the method, the component carrier, and the electric device will be explained.

Different exemplary embodiments relate to different configurations: In one embodiment, the coil structure is partially or completely configured as inlay, while the magnetic core forms part of the laminated stack. In another embodiment, the coil structure forms part of the laminated stack, while the magnetic core is partially or completely configured as inlay. In yet another embodiment, both coil structure and magnetic core are partially or completely configured as inlay.

In an embodiment, at least part of at least one of the coil structure and the magnetic core forms part of the laminated stack rather than being configured as an inlay embedded in the stack. Thus, while one of the coil structure and the magnetic core may be a separate inlay, it may be also advantageous that another one of the core structure and the magnetic core forms part of the stack of layer structures of the component carrier. The latter can then be synergistically used also as a constituent of the embedded inductor. For instance, patterned copper foils in combination with vertical through connections made of copper (for example copper filled laser vias) between and/or in resin layers (optionally comprising glass fibers) of the component carrier stack may be combined so as to form one or more windings in component carrier material. Portions of the component carrier stack which are not used for other tasks may thus be functionalized to form part of the embedded inductor. With such an architecture, a hybrid inductor embedded in a component carrier may be provided, wherein part of the hybrid inductor is formed by a specifically configurable inlay, and another part of the hybrid inductor may be formed by component carrier material (in particular a layer stack thereof). Such a concept may combine the advantages of specifically configurable inlays and the efficient and synergetic use of parts of the stack for providing different parts of an inductor functionality.

In an embodiment, the coil structure comprises interconnected electrically conductive elements surrounded by a dielectric matrix. In particular, the electrically conductive elements may be made of copper (for instance in an embodiment in which the inductor is embedded in a PCB board) or aluminum (for instance in an embodiment in which the inductor is embedded in an IMS board). The dielectric matrix may for instance be prepreg or FR4.

Alternatively, a coil structure, made from interconnected electrically conductive elements, may be arranged on a dielectric matrix.

In an embodiment, the electrically conductive elements comprise planar elements in planes being parallel to one or more planes of the at least one electrically insulating layer structure of the stack and comprise vertical elements connecting the planar elements and extending perpendicular to the planes of the planar elements. The planar elements may be embodied as patterned copper foils. The vertical elements may be copper filled laser vias, copper filled mechanically drilled vias, copper pillars, copper inlays, etc. Descriptively speaking, the one or more windings may be formed by the planar elements, whereas connections between adjacent windings may be formed by the vertical elements.

In an embodiment, the coil structure has a ring shape. Such a ring may be a circumferential structure delimiting a through hole. The shape of the ring may, for instance, be circular or rectangular.

In an embodiment, the magnetic core comprises a ferrite material. A ferrite may be a ceramic material which may be made by mixing and firing large proportions iron oxide ($Fe_2O_3$) blended with small proportions of one or more additional metallic elements, such as manganese, nickel, etc. Ferrites may be electrically insulating and ferrimagnetic. In particular, the magnetic core may comprise a soft ferrite which has a low coercivity, so they may easily change their magnetization, and act as conductors of magnetic fields. This may be in particular advantageous for applications such as high-frequency inductors and transformers. Solid ferrite structures may be formed by sintering ferrite powder. It is also possible to use ferrite platelets or flakes for manufacturing ferrite structures. However, in other exemplary embodiments, the magnetic core may be made of other magnetic materials, in particular ferromagnetic or ferrimagnetic or paramagnetic materials.

In an embodiment, the magnetic core comprises a material having a magnetic permeability ($\mu_r$) of at least 10, in particular of at least 100. For instance, the magnetic permeability of ferrite sheets may be in a range between 300 and 400. The magnetic permeability of ferrite paste may be in the range between 10 and 60.

In an embodiment, the magnetic core comprises a plurality of separate magnetic bodies. Such magnetic bodies may be in particular one or more magnetic sheets, one or more magnetic posts, and/or one or more magnetic paste structures. This offers a variable construction set for a component carrier designer for properly adjusting magnetic properties of the component carrier in accordance with the requirements of a certain application. For instance, the embedded inductor may be formed by stacking multiple magnetic bodies, in particular two or three layers of magnetic bodies. Additionally or alternatively, it is also possible to arrange multiple magnetic bodies in the same layer. For example, magnetic posts may be cut (for instance by laser cutting) based on magnetic sheets. Magnetic paste may for instance be applied by screen printing, in particular to close magnetic paths by filling remaining air gaps.

In an embodiment, the magnetic bodies are connected to one another so as to form a closed magnetic path. For obtaining a closed magnetic path, it is possible that air gaps between adjacent magnetic bodies are filled with ferrite paste or the like. Descriptively speaking, a closed and uninterrupted magnetic loop or ring structure may be formed by material of the magnetic bodies, in particular ferrite. When the magnetic path is closed, it can be ensured that the magnetic field extends substantially within the material of the magnetic core without weakening, which may be advantageous for applications in which no magnetic losses are desired.

In another embodiment, the magnetic bodies are connected to one another so as to form an open magnetic path with at least one non-magnetic gap in between. In particular, the at least one non-magnetic gap may comprise an airgap, a gap filled with material of an electrically insulating layer structure, etc. Hence, at least one non-magnetic gap may be intentionally and selectively formed in an interior of the component carrier, more specifically in an interior of the inductor. Such a non-magnetic gap may be an air gap, i.e. a volume being free of solid material. However, it is also possible that the non-magnetic gap is formed by a non-magnetic solid material, in particular electrically insulating material (in particular, but not exclusively, of the stack). For example, a gap may be filled with an electrically insulating material such as resin. When the magnetic path is opened by the non-magnetic gap, a magnetic stray field may develop in the surrounding of the inductor. This may be desired in certain applications in which it is desired that a magnetic field of sufficiently high strength is also present around the component carrier (for instance for a wireless charger allowing an electronic apparatus to be charged in the surrounding of the component carrier by an inductive coupling so that the magnetic stray fields charge the electronic apparatus).

More generally, the adjustment of the combination of one or more closed magnetic paths and one or more opened magnetic paths as a consequence of the formation or omission of one or more non-magnetic gaps may allow spatially controlling the magnetic properties of the component carrier.

In an embodiment, the at least one non-magnetic gap spaces adjacent ones of the magnetic bodies by at least 75 µm, and in particular of at least 150 µm. It has turned out that with these dimensions, a significant control of the magnetic properties within and/or in the surrounding of the component carrier is possible.

In an embodiment, a surface of at least part of the magnetic core has a roughness, Ra, of less than 4 µm, in particular less than 2 µm.

The value of the roughness Ra may be preferably less than 500 nm. The roughness of a surface may be defined as and may be measured as the centerline average height Ra. Ra is the arithmetic mean value of all distances of the profile from the centerline. For instance, the measurement may be carried out according to DIN 4768. The mentioned low roughness values as a result of precisely defined cutting surfaces can be obtained by forming at least one magnetic element of the magnetic core by laser cutting of a magnetic body. With such smooth and precisely defined cutting surfaces, the magnetic properties of the magnetic core may be adjusted with high accuracy. In contrast to the mechanical grinding of ferrite bodies, which may result in an increase of the loss factor and a reduction of permeability, magnetic bodies formed by laser processing of ferrite bodies suffer much less from such shortcomings.

In an embodiment, the component carrier is configured as a power converter or inverter, in particular as one of a DC/DC converter and a DC/AC converter. A DC/DC (or DC-to-DC) converter may be denoted as an electronic device or electromechanical device that converts a source of direct current (DC) from one voltage level to another. A DC/AC (or DC-to-AC) converter may be denoted as an electronic device or circuitry that changes direct current to alternating current (AC).

In an embodiment, the component carrier is configured as a wireless charger for wirelessly charging an electronic apparatus. In such an embodiment, an electronic apparatus to be electrically charged with electric energy may be placed in an environment of the component carrier with the embedded inverter. A magnetic field of the inductor in an exterior of the component carrier can then be coupled into the electronic apparatus for wirelessly charging the electronic apparatus (for instance a mobile phone).

In an embodiment, the component carrier comprises at least one further inductor arranged at least partially in the stack and comprising a further electrically conductive coil structure wound around a further coil opening and a further magnetic core. At least part of the further magnetic core may at least partially fill the further coil opening. Hence, it is possible to embed multiple (functionally cooperating or functionally separate) inductors in one and the same component carrier. Preferably but not necessarily, at least one of the further coil structure and the further magnetic core may be configured as an inlay embedded in the stack.

In an embodiment, the inductor and the at least one further inductor are magnetically coupled. For instance, the inductor and a further inductor may be configured as a transformer. For this purpose, the inductor and the further inductor may cooperate to transfer electrical energy between different circuits through electromagnetic induction. In other embodiments, three or even six inductors of a component carrier may be magnetically coupled, for instance for a DC to DC converter, a DC to AC converter or motor drives.

In an embodiment, at least a part of the magnetic cores of the inductor and the at least one further inductor are formed as an integral structure, in particular is a common magnetic sheet. Such a configuration is simple to manufacture, involves only low magnetic losses and allows for a compact design (compare for instance FIG. 5).

In an embodiment, the magnetic core comprises a magnetic post extending through the coil opening and comprises a magnetic sheet extending laterally beyond the magnetic post and at least partially over the coil structure. These constituents are present in all embodiments of FIG. 1 to FIG. 7.

In an embodiment, the magnetic core comprises a further magnetic sheet extending laterally beyond the magnetic post and at least partially over the coil structure, wherein the magnetic post is arranged between the magnetic sheet and the further magnetic sheet. As a result, a dog bone shaped structure may be obtained (compare for example FIG. 4).

In an embodiment, the magnetic core comprises at least one further magnetic post extending parallel to the magnetic post, wherein the coil structure is arranged between the magnetic post and the at least one further magnetic post. In such a configuration, a circumferentially closed magnetic core may be obtained (compare for instance FIG. 1).

In an embodiment, the component carrier comprises at least one component embedded in the component carrier. For instance, such a component may be an active component or a passive component.

Components capable of controlling current by means of another electrical signal may be denoted as active components (for instance semiconductor chips). Components incapable of controlling current by means of another electrical signal may be called passive devices. Resistors or capacitors are examples for passive components. In particular, it is possible to accommodate one or more (in particular active and/or passive) components between the windings of the coil structure, more generally in an appropriate volume of the embedded inductor. Still more generally, the at least one component may be embedded in one of the group consisting of the stack, the coil structure, and the magnetic core.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier (for example a printed circuit board, a substrate, or an interposer) in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

A substrate or interposer may comprises or consist of at least a layer of glass, silicon, ceramic and/or organic material (like resin). A substrate or interposer may also comprises a photoimageable or dry-etchable organic material like epoxy-based Build-Up films or polymer compounds like Polyimide, Polybenzoxazole, or Benzocyclobutene.

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, glass-spheres, multi-layer glass, glass-like materials), prepreg material, photoimageable dielectric material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg, FR4, or epoxy-based Build-Up Film or photoimageable dielectrics are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type component carrier. In such an embodiment, the component carrier is a compound of multiple layer structures which are stacked and connected together by applying a pressing force, if desired accompanied by heat.

The aspects defined above and further aspects of the invention are apparent from the examples of embodiment to be described hereinafter and are explained with reference to these examples of embodiment.

BRIEF DESCRIPTION OF THE DRAWINGS

Embodiments of the component carrier can be better understood with reference to the following drawings. The elements and features in the drawings are not necessarily to scale, emphasis instead being placed upon clearly illustrating the structures and principles of operation of the assemblies.

DETAILED DESCRIPTION OF ILLUSTRATED EMBODIMENTS

Figure 1:
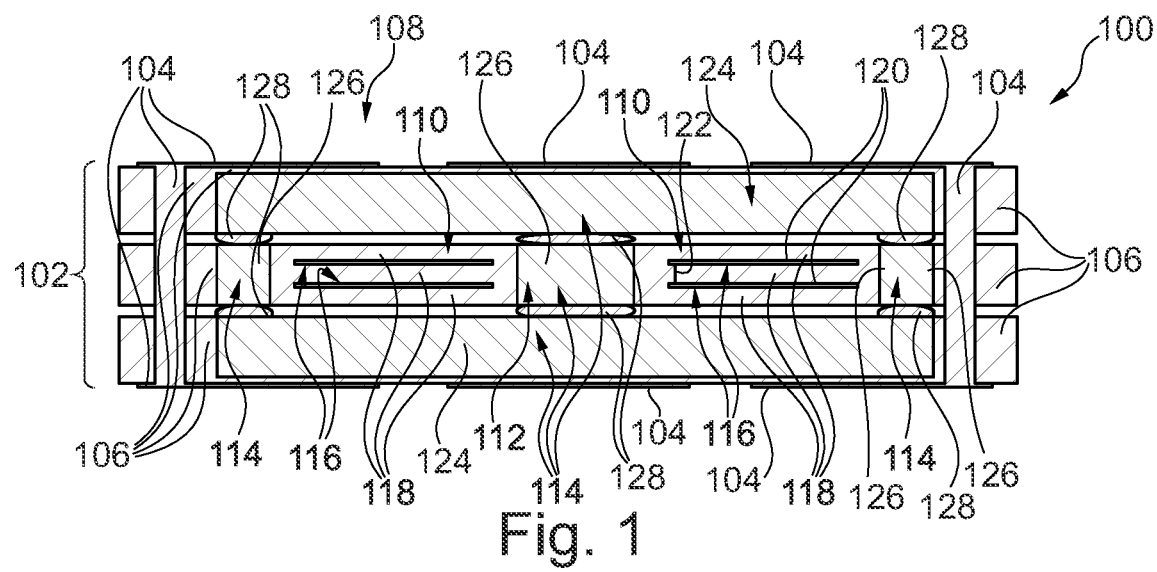
FIG. 1 illustrates a cross-sectional view of a component carrier with an embedded inductor having a closed magnetic core according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a component carrier with an embedded inductor with an ultra-flexible structure is provided. Such an embedded inductor may be manufactured advantageously with a high degree of freedom.

Magnetic material (for example ferrite beads) may be used in combination with copper windings to form chokes, also called inductor. Such an inductor may be designed to have high inductance values at comparably small physical size.

According to an exemplary embodiment, it is possible to build a component carrier (in particular a PCB) with an inductor having substantially any desired shape. Such an inductor may comprise a coil structure (which may be formed as a number of connected copper windings), and a magnetic core with one or more pre-formed ferrite parts and optionally ferrite paste. More generally, the ferrite structure may be any appropriate magnetic structure capable of increasing the inductivity of the embedded inductor. One or more non-magnetic regions interrupting a closed loop magnetic path along magnetic material, for instance air gaps or electrically insulating regions of the component carrier, may be formed as part of the embedded inductor at any desired position at which they are needed for a specific application.

An exemplary embodiment of the invention therefore provides an embedding process using multi-part magnetic cores being freely definable in accordance with a desired application. With such a manufacturing architecture, a component carrier with one or more embedded inlays may be provided fulfilling an inductor function.

An analysis has shown that, for specific applications, one ferrite ring might not suffice to form an inductor with appropriate values of inductivity for certain applications, for instance to operate it with high currents up to 30 amperes or more. A basic target of such applications may be to construct an inductor with small physical dimensions and high inductance values. To enable lowest heights to meet requirements of component carrier technology, inductive core materials can be used to generate any desired geometric shape. Around such a core a copper winding may be introduced to form the inductor. This leads to the advantage of a high degree of freedom during inductor construction combined with pronounced integration methods to form small power supply circuits.

According to an exemplary embodiment, a PCB or another component carrier can be used to construct an inductor in substantially any desired shape. For instance, it is possible to form an E-shaped core separated into three embedded core materials and formed together by base materials (for example prepreg). Basically every combination of embedding and a build-up involving cavities (which may be formed for example using release layers having a poor adhesion with regard to surrounding component carrier material) is possible to be used for such embodiments.

Optionally, a non-magnetic region such as an air gap can be introduced into the magnetic core of the embedded inductor to fine-tune the magnetic properties of the component carrier with the embedded inductor. Advantageously, a minimum air gap may be 75 µm. For inductors without any air gaps, a ferrite paste material can be printed before a press cycle.

As winding or coil structure, a pre-manufactured PCB inlay may be advantageously used. For example, such a coil structure may be embodied as a PCB (in particular with only two layers). Alternatively, it is possible that the core structure is embodied as an IC (integrated circuit) substrate, enabling a higher layer count. The mentioned inlay may be used in a board-in-board configuration.

For applications such as power converters with extremely high integration ratios, a component such as a die can also be embedded into the inlay inside the ferrite inductor. This may enable smallest package sizes which are only limited by the desired inductance value.

As presented and described, an embedded inductor in a component carrier can have nearly any shape so that the freedom of designing the shape for a component carrier designer is high. Furthermore, high inductance values are possible with the described manufacturing procedure. Furthermore, a high integration density may be obtained, which may be for instance advantageous for applications such as power electronic converters.

FIG. 1 illustrates a cross-sectional view of a plate-shaped laminate-type component carrier 100 with an embedded inductor 108 having a closed magnetic core 114 according to an exemplary embodiment of the invention.

The component carrier 100 is here embodied as a printed circuit board (PCB). The component carrier 100 comprises a laminated stack 102 composed of electrically conductive layer structures 104 and electrically insulating layer structures 106. For example, the electrically conductive layer structures 104 may comprise patterned copper foils and vertical through connections, for example copper filled laser vias. The electrically insulating layer structures 106 may comprise a resin (such as epoxy resin), optionally comprising reinforcing particles therein (for instance glass fibers or glass spheres). For instance, the electrically insulating layer structures 106 may be made of prepreg or FR4. The layer structures 104, 106 may be connected by lamination, i.e. the application of pressure and/or heat.

The inductor 108 is embedded in the stack 102. For this purpose, one or more cavities may be formed in the stack 102, and a respective constituent of the inductor 108 may be inserted in such a cavity. For instance, such a cavity may be formed by mechanically processing the stack 102, for instance by milling or drilling by mechanically processing or laser processing. It is also possible to form such a cavity by laminating a release layer in an interior of the stack 102. Such a release layer may be made of a material (for instance a waxy material, or polytetrafluoroethylene) having poor adhesion properties with regard to surrounding component carrier material. Subsequently, a piece of material of the stack 102 may then be cut out above the release layer, for instance by carrying out a circumferential cut using a laser or a mechanical drilling tool. The piece may then simply be taken out of the stack 102 due to the poor adhesion between the release layer and adjacent material of the stack 102, so that a cavity is obtained.

As can be taken from FIG. 1, the embedded inductor 108 comprises in particular two constituents, i.e. a coil structure 110 and the magnetic core 114. The electrically conductive coil structure 110 is wound with one or more windings around a central coil opening 112. A part of the magnetic core 114 fills the coil opening 112, whereas another part of the magnetic core 114 surrounds the coil structure 110 both laterally and vertically.

In the shown embodiment, the coil structure 110 comprises interconnected electrically conductive elements 116 surrounded by a dielectric matrix 118.

The dielectric matrix 118 may electrically isolate electrically conductive elements 116 from one another and may contribute therefore to the formation of the one or more windings of the coil structure 110. The dielectric matrix 118 may be made for instance from resin (such as epoxy resin), and may optionally comprise reinforcing particles (such as glass fibers or glass spheres). In one embodiment, the dielectric matrix 118 may form part of the electrically insulating layer structures 106 of the stack 102.

The electrically conductive elements 116 may be made of copper so as to be properly compatible with component carrier (in particular PCB) manufacturing technology. More specifically, the electrically conductive elements 116 comprise planar elements 120 extending within a horizontal plane. The planar elements 120 may be formed by patterning copper layers. As can be taken from FIG. 1, the planar elements 120 extend in parallel planes (wherein each of these planes corresponds to an assigned winding of the coil structure 110) which are also parallel to planes of the stacked electrically insulating layer structures 106 of the stack 102. The planar elements 120 may be connected with one another so as to form one or more windings of the coil structure 110. In one embodiment, the planar elements 120 may even form part of the layer-type electrically conductive layer structures 104, i.e. can be embodied as correspondingly manufactured portions of the stack 102. The electrically conductive elements 116 additionally comprise vertical elements 122, for example copper filled laser vias. Each of the vertical elements 122 may mechanically and electrically connect planar elements 120 of adjacent layers. Thus, the planar elements 120 may in particular extend perpendicular to the planes of the planar elements 120. The vertical elements 122 may electrically and mechanically connect adjacent windings in different (in particular parallel) planes to thereby complete the formation of the coil structure 110. In one embodiment, the vertical elements 122 may even form part of the electrically conductive layer structures 104 which are embodied as vertical through connections, i.e. can be embodied as correspondingly manufactured portions of the stack 102.

In the described embodiment in which the planar elements 120 and the vertical elements 122 form part of the stack 102, the coil structure 110 forms part of the component carrier material. In such an embodiment, it is possible to manufacture the coil structure 110 in a region of the stack 102 which is not needed for the wiring functionality of component carrier 100. In another embodiment, however, the coil structure 110 with their planar elements 120 and their vertical elements 122 can be embodied as an inlay, i.e. as a pre-manufactured component to be embedded in the stack 102. For instance, the coil structure 110 may then also be a small component carrier (such as a PCB or an IC substrate) which is embedded in the stack 102 in a board-in-board configuration.

Although not shown in the cross-sectional view of FIG. 1, the coil structure 110 may have a ring shape being exteriorly delimited by the one or more windings formed by the electrically conductive elements 116 and having an interior through hole as coil opening 112. Such a ring may have a circular ring shape or a rectangular ring shape.

The magnetic core 114 of the embedded inductor 108 comprises a soft magnetic (in particular a ferrimagnetic or ferromagnetic) material having a sufficiently high magnetic permeability (for instance of at least 10) to obtain a high value of the inductivity of the inductor 108. Preferably, the magnetic core 114 comprises a ferrite material. This ferrite material may comprise a first ferrite constituent in a solid state (see reference numerals 124, 126 described below) and a second ferrite constituent in a paste state (see reference numeral 128 described below). As can be taken from FIG. 1, the magnetic core 114 may comprise a plurality of separate magnetic bodies which may be connected to one another to form the magnetic core 114 of desired shape, dimension and position. In the illustrated embodiment, the magnetic bodies forming the magnetic core 114 comprise two magnetic sheets 124 in two parallel planes, three magnetic posts 126 all arranged in a third plane between the two planes of the magnetic sheets 124, and six sections of magnetic paste 128 closing gaps between adjacent ones of the magnetic bodies in the three mentioned planes. Due to the shown configuration of the magnetic bodies, and in particular due to the magnetic paste 128 bridging magnetic sheets 124 and magnetic posts 126, the various magnetic bodies are magnetically connected to one another so as to form a closed magnetic ring path without non-magnetic gaps (such as air gaps) in between. By taking this measure, it can be ensured that the magnetic field remains substantially completely in an interior of the magnetic core 114 with low magnetic loss.

More specifically, the magnetic core 114 of FIG. 1 comprises a central magnetic post 126 extending in a central plane through the coil opening 112. In a bottom layer, a bottom magnetic sheet 124 extends laterally beyond the magnetic post 126 and also extends laterally beyond the coil structure 110. Furthermore, the magnetic core 114 of FIG. 1 comprises a top magnetic sheet 124 extending in a plane above the central magnetic post 126 and laterally beyond the magnetic post 126 and laterally beyond the coil structure 110. In a vertical direction, the central magnetic post 126 is arranged between the bottom magnetic sheet 124 and the top magnetic sheet 124. Beyond this, the magnetic core 114 comprises two further lateral magnetic posts 126 extending parallel to the central magnetic post 126 and laterally enclosing the central magnetic post 126. All three magnetic posts 126 are arranged coplanar, i.e. in a common plane. The coil structure 110 is arranged in a lateral or horizontal direction between the central magnetic post 126 and the two lateral magnetic posts 126.

What concerns the manufacturing of the magnetic core 114, it is possible that the magnetic sheets 124 are connected with the other layer structures 104, 106 of the stack 102 during the lamination process which forms the stack 102. In other words, the magnetic sheets 124 may be treated in terms of manufacturing as further layer structures in addition to layer structures 104, 106 of the stack 102.

In contrast to this, the magnetic posts 126 of the magnetic core 114 may be cut out from a larger magnetic body (such as a magnetic sheet 124) by laser cutting. As a result of such a laser cutting, the surface properties of the magnetic posts 126 may be well defined and may be cut without a significant increase of the loss factor and without a significant decrease of magnetic permeability (as it may occur with conventional grinding procedures), substantially without surface profile and with low surface roughness. The magnetic properties of the embedded inductor 108 may therefore be adjusted accurately. As a result of such a laser cutting procedure, the cut surfaces of the magnetic posts 126 may have a roughness Ra of preferably less than 500 nm. During the manufacturing of component carrier 100, the magnetic posts 126 may be treated as embedded components or inlays, i.e. may be embedded in cavities formed in the stack 102.

What concerns the magnetic paste 128 (in particular a ferrite paste comprising printable ferrite powder, optionally in a solvent or the like), the latter may be applied by printing the magnetic paste 128 on desired surface portions of the magnetic posts 126 and/or the magnetic sheets 124. The interconnection between the magnetic paste 128 on the one hand and the magnetic posts 126 or the magnetic sheets 124 on the other hand may then be accomplished during the above-mentioned lamination process.

Highly advantageously, the coil structure 110 and/or magnetic core 114 may be configured as one or more inlays embedded in the stack 102. Such an inlay may be pre-manufactured and may be inserted into the stack in accordance with a component embedding manufacturing process. By pre-manufacturing such one or more inlays, the properties of the respective inlay may be selectively and specifically adapted to the functional requirements of the magnetic core 114 and/or the coil structure 110. In one embodiment, at least part of the described constituents of the magnetic core 114 may be provided as inlay, in particular the one or more magnetic posts 126. In the embodiment of FIG. 1, three inlays are provided in form of the three magnetic posts 126. It is also possible that also the coil structure 110 is pre-manufactured as a ring structure and is inserted in the corresponding cavity of the stack 102 during the manufacturing process. In such an embodiment, the coil structure 110 may for instance be a small PCB or IC substrate to be embedded in the stack 102 in a board-in-board configuration.

However, it is alternatively also possible that at least part of the coil structure 110 or at least part of the magnetic core 114 forms part of the stack 102. For instance, the magnetic sheets 124 may be treated as layers or layer structures in the lamination procedure during which the layer structures 104, 106 are connected by lamination. Additionally or alternatively, it is possible that the coil structure 110 forms part of the stack 102. In such an embodiment, the electrically conductive elements 116 may be configured as part of the electrically conductive layer structures 104, and the dielectric matrix 118 may be configured as part of the electrically insulating layer structures 106.

The configuration of FIG. 1 with the closed magnetic core 114 can be used as a basis for manufacturing a high-frequency coil or a transformer. In particular, it is also possible to use the component carrier 100 of FIG. 1 as a basis for manufacturing a power converter (such as a DC/DC converter or a DC/AC converter).

Figure 2:
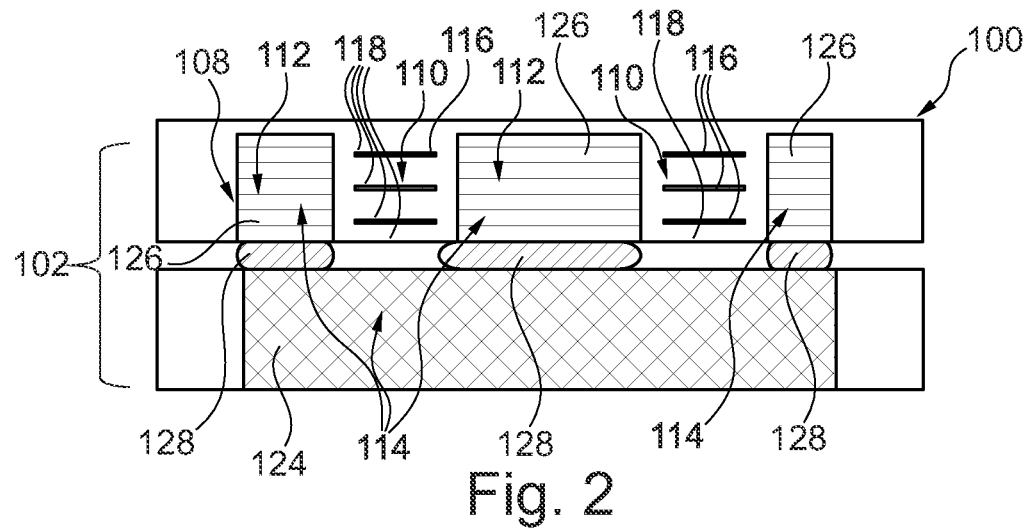
FIG. 2 illustrates a cross-sectional view of a component carrier with an embedded inductor having an open magnetic core according to another exemplary embodiment of the invention.

FIG. 2 illustrates a cross-sectional view of a component carrier 100 with an embedded inductor 108 having an open magnetic core 114 according to another exemplary embodiment of the invention. Descriptively speaking, this component carrier 100 may also be denoted as an embodiment with an open E core.

The embodiment of FIG. 2 differs from the embodiment of FIG. 1 in that the top magnetic sheet 124 is omitted in FIG. 2. Correspondingly, the three upper structures of magnetic paste 128 are omitted in FIG. 2 as well. It is for instance possible to attach a magnetic lid (not shown) to the top of the component carrier 100 shown in FIG. 2 in order to keep the upper side of the magnetic core 114 open.

The construction of the embodiment of FIG. 2 is particularly simple.

Figure 3:
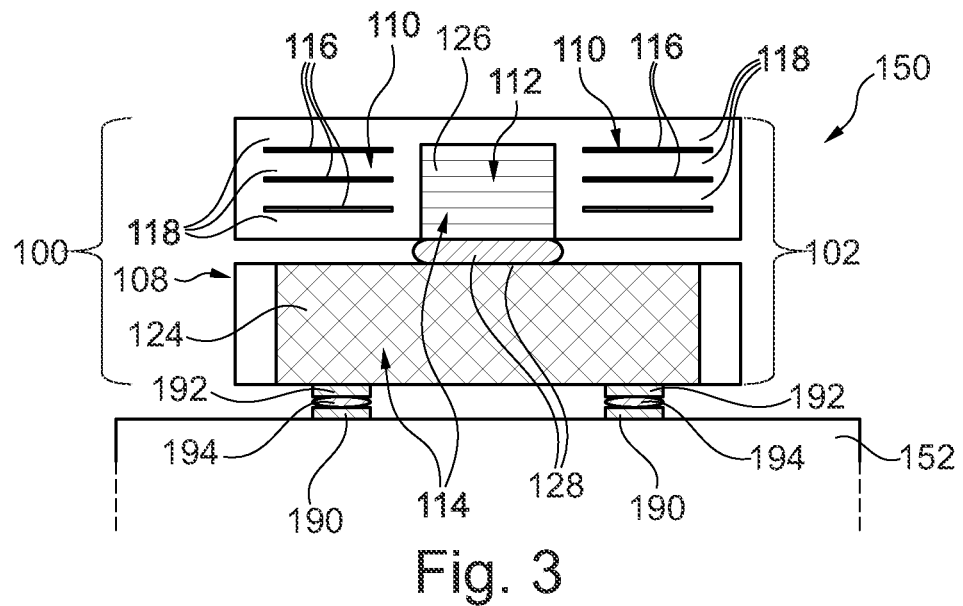
FIG. 3 illustrates a cross-sectional view of an electric device comprising a support body and a component carrier with an embedded inductor mounted on the support body, wherein the electric device is configured as wireless charging device according to another exemplary embodiment of the invention.

FIG. 3 illustrates a cross-sectional view of an electric device 150 according to an exemplary embodiment of the invention. The electric device 150 comprises a (for instance PCB-type) support body 152 and a component carrier 100 mounted thereon. The component carrier 100 is provided with an embedded inductor 108 and is configured as wireless charging device. For instance, an electronic apparatus (not shown) such as a mobile phone may be placed on top of the component carrier 100 so that an inductive coupling between the electronic apparatus and the inductor 108 may accomplish the wireless charging of the electronic apparatus based on magnetic energy provided by the inductor 108. Thus, the electric device 150 is configured as a wireless charger for wirelessly charging the electronic apparatus. Pads 190 of the support body 152 may be electrically and mechanically connected to pads 192 of the component carrier 100 by soldering, see solder structures 194.

The embodiment of FIG. 3 has a particularly simple configuration of the embedded inductor 108. Compared to the embodiment of FIG. 2, the lateral magnetic posts 126 including the assigned structures of magnetic paste 128 are omitted according to FIG. 3. According to FIG. 3, the magnetic path is open on top of the component carrier 100. Descriptively speaking, the magnetic field lines consequently also extend vertically above the component carrier 100, into the electronic apparatus to be charged, and back into the magnetic sheet 124 on the bottom.

Figure 4:
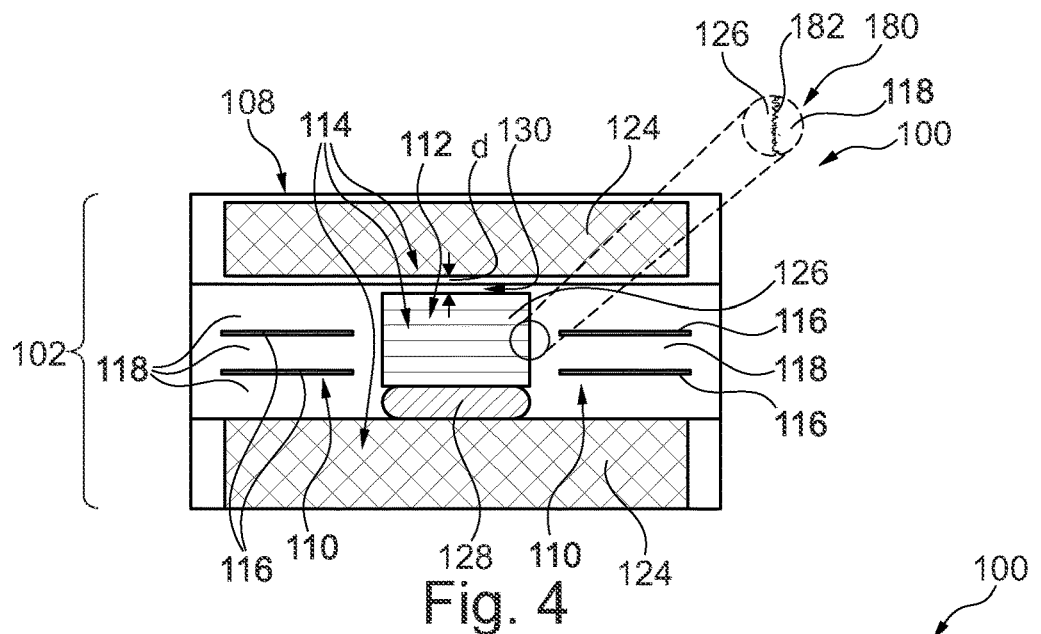
FIG. 4 illustrates a cross-sectional view of a component carrier with an embedded inductor with an air gap according to another exemplary embodiment of the invention.

FIG. 4 illustrates a cross-sectional view of a component carrier 100 with an embedded single inductor 108 with a non-magnetic gap 130 according to another exemplary embodiment of the invention. The non-magnetic gap 130 extends along a vertical extension, d, of preferably 75 µm or more. For example, the non-magnetic gap 130 may be embodied as airgap or as gap filled with a non-magnetic material such as prepreg. In view of the non-magnetic gap 130, the magnetic bodies spaced by this non-magnetic gap 130 (in the shown embodiment the central magnetic post 126 and the top magnetic sheet 124) are only weakly magnetically coupled with one another so as to form an open magnetic path with the non-magnetic gap 130.

The magnetic core 114 of the embodiment of FIG. 4 has the shape of a dog bone and is composed of the two exterior magnetic sheets 124, the central magnetic post 126 sandwiched vertically in between, and the magnetic paste 128 magnetically connecting the bottom magnetic sheet 124 with the central magnetic post 126.

Reference is made in the following to a detail 180 in FIG. 4 which illustrates schematically the surface profile of a side wall 182 of the magnetic post 126. As already discussed in the description referring to FIG. 1, as a result of a laser cutting procedure which may be carried out for forming the magnetic post 126 from a magnetic sheet 124 or any other ferrite raw body, the cut surface of the magnetic post 126 has a relatively low roughness Ra of preferably less than 2 µm, more preferably of not more than 500 nm.

The configuration of FIG. 4 has the advantage that it can be manufactured with low effort and with compact design. With the asymmetric arrangement of the magnetic paste 128 in a vertical direction closing a magnetic path on the bottom side on the one hand and the non-magnetic gap 130 keeping a magnetic path on the top side open, the spatial behavior of the inductor 108 and also the characteristics of the value of the inductivity can be influenced in accordance with the requirements of a certain application.

Figure 5:
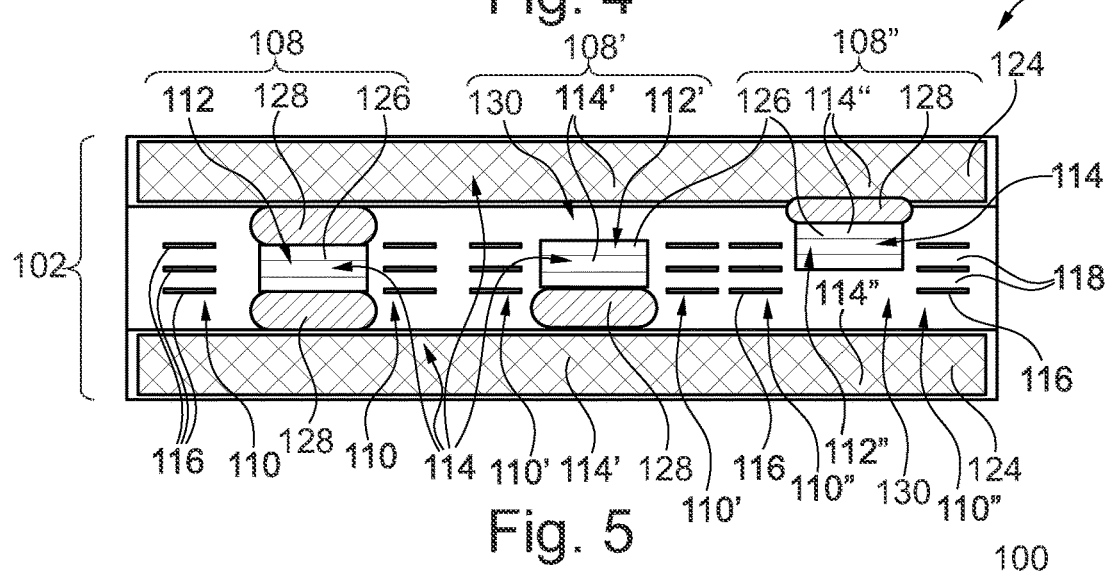
FIG. 5 illustrates a cross-sectional view of a component carrier with multiple magnetically coupled inductors according to another exemplary embodiment of the invention.

FIG. 5 illustrates a cross-sectional view of a component carrier 100 with three coupled inductors 108, 108', 108" according to another exemplary embodiment of the invention. The three coupled inductors 108, 108', 108" are arranged laterally side-by-side and in such a way, that the magnetic fields of the inductors 108, 108', 108" are coupled via their laterally adjacent coil structures 110. For instance, the three inductors 108, 108', 108" coupled in the fashion shown in FIG. 5 can be used for a DC to DC converter, a DC to AC converter or a motor drive.

Hence, the component carrier 100 of FIG. 5 comprises the three inductors 108, 108', 108" embedded in a vertically central region of the stack 102. As described above for the inductor 108, also each of the further inductors 108', 108" comprises a respective further electrically conductive coil structure 110', 110" (which may be embodied either as separate inlays or as part of the layer stack 102) wound around a respective further coil opening 112', 112". Furthermore, a further magnetic core 114', 114" is foreseen for each of the further inductors 108', 108". Each of the magnetic cores 114, 114', 114" comprises a respective magnetic post 126 (which may be for instance configured as an inlay) and a respective portion of each of a bottom magnetic sheet 124 and a top magnetic sheet 124 which are provided in common for all three inductors 108, 108', 108" of the component carrier 100. Thus, the common magnetic sheets 124 of the magnetic cores 114, 114', 114" of the inductors 108, 108', 108" are formed as an integral layer structure in common for all magnetic cores 114, 114', 114". Each of the magnetic posts 126 of the respective magnetic core 114, 114', 114" fills the respectively assigned coil opening 112, 112', 112".

However, the specific magnetic properties of the component carrier 100 may again be adjusted as magnetically closed or magnetically opened by individually configuring the upper and/or lower magnetic coupling between a respective one of the magnetic posts 126 on the one hand and a respective portion of one of the magnetic sheets 124 on the other hand. A magnetically open configuration can be achieved by providing such an interface with a non-magnetic gap 130 (see top interface of inductor 108' and bottom interface of inductor 108"). A magnetically closed configuration can be achieved by providing such an interface with ferrite paste 128 or another appropriate magnetic connection structure (see top and bottom interface of inductor 108, bottom interface of inductor 108', and top interface of inductor 108").

Figure 6:
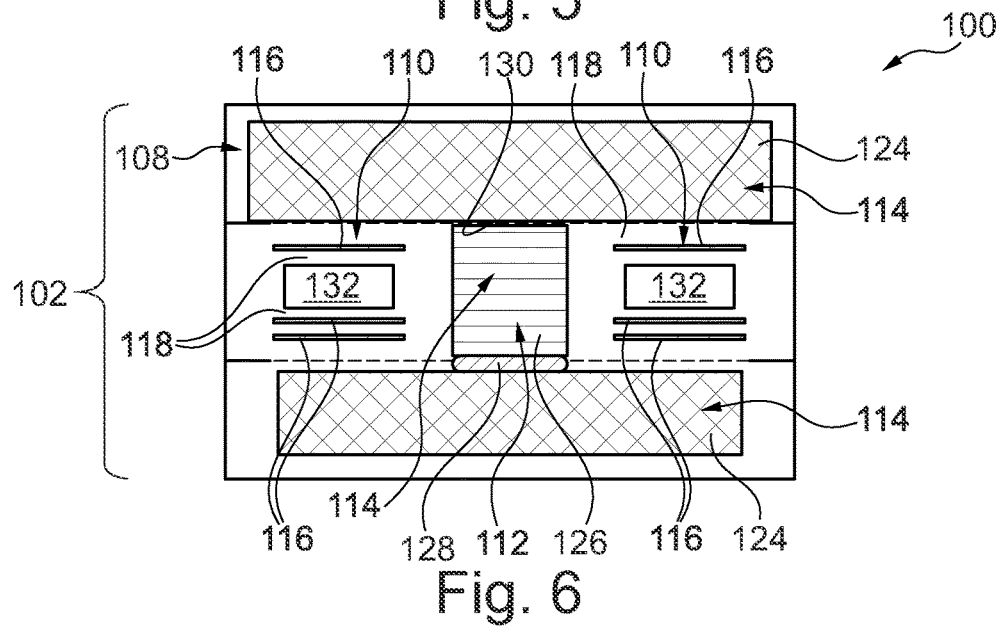
FIG. 6 illustrates a cross-sectional view of a component carrier with an embedded inductor and cooperating active components according to another exemplary embodiment of the invention.

FIG. 6 illustrates a cross-sectional view of a component carrier 100 with an embedded inductor 108 and two active components 132 according to another exemplary embodiment of the invention.

As shown in FIG. 6, the component carrier 100 comprises two active components 132, which may be configured as semiconductor dies, embedded in the component carrier 100. More precisely, the two active components 132 are embedded between windings of the coil structure 110 of the inductor 108. Additionally or alternatively, it is also possible to embed at least one passive component and/or to embed at least one (in particular active or passive) component in another region of the component carrier 100, for instance in the stack 102 or in the magnetic core 114.

Figure 7:
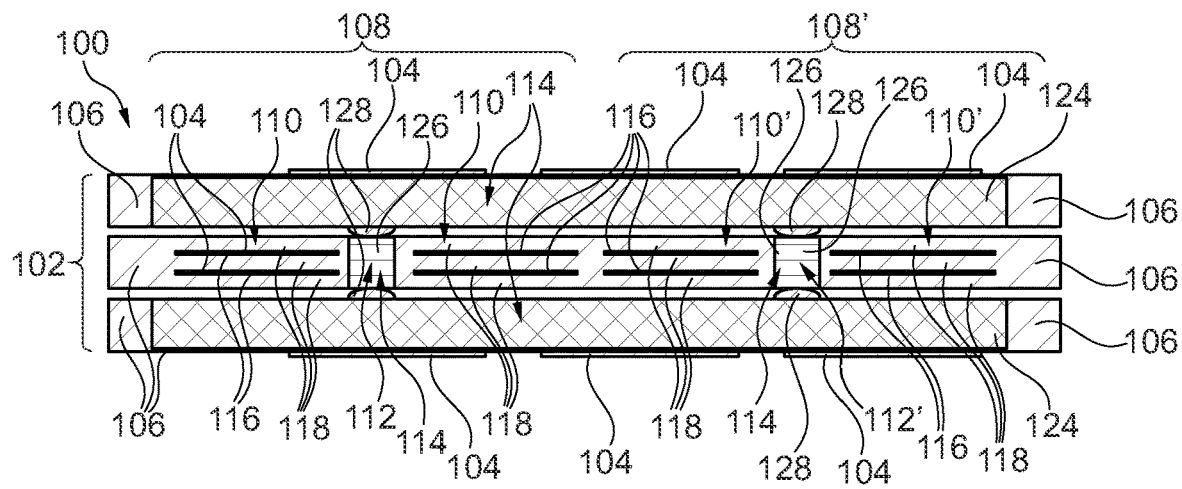
FIG. 7 illustrates a cross-sectional view of a component carrier with two inductors coupled for forming a transformer according to another exemplary embodiment of the invention.

FIG. 7 illustrates a cross-sectional view of a component carrier 100 with two inductors 108, 108' coupled for forming a transformer according to another exemplary embodiment of the invention. In contrast to FIG. 6, only two magnetically coupled inductors 108, 108' are foreseen according to FIG. 7. A completely closed magnetic path is accomplished by the four shown structures of magnetic paste 128 to keep the overall magnetic loss very small.

Figure 8:
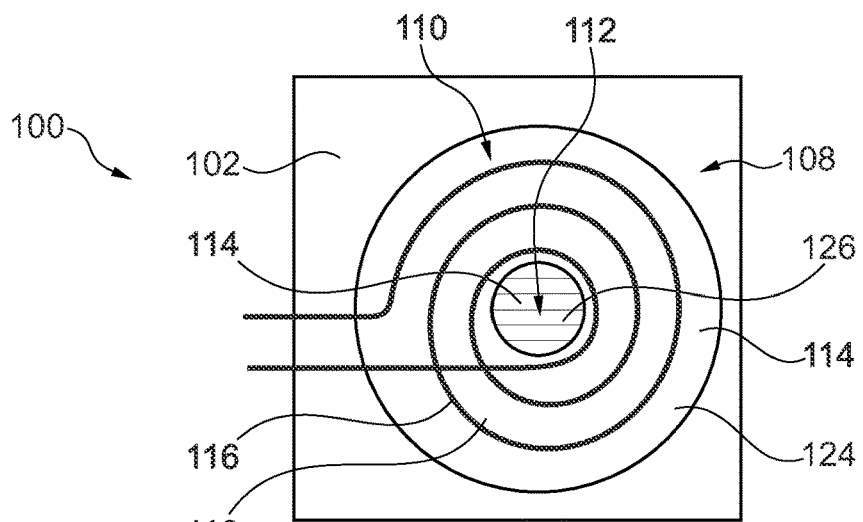
FIG. 8 illustrates a plan view of a component carrier with embedded inductor according to another exemplary embodiment of the invention.

FIG. 8 illustrates a plan view of a component carrier 100 with a single embedded inductor 108 according to another exemplary embodiment of the invention. The embodiment of FIG. 8 is similar to the component carrier 100 of FIG. 3.

Figure 9:
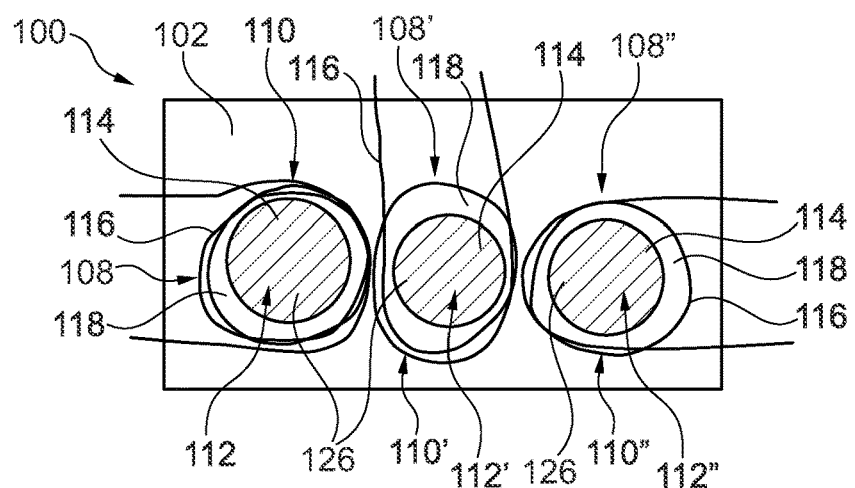
FIG. 9 illustrates a plan view of a component carrier with three coupled inductors according to another exemplary embodiment of the invention.

FIG. 9 illustrates a plan view of a component carrier 100 with three coupled inductors 108, 108', 108" according to another exemplary embodiment of the invention. The exact geometric shape can be adapted in accordance with a specific application.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

Implementation of the invention is not limited to the preferred embodiments shown in the figures and described above. Instead, a multiplicity of variants is possible which use the solutions shown and the principle according to the invention even in the case of fundamentally different embodiments.

I claim:

1. A component carrier, comprising:
a stack comprising at least one electrically conductive layer structure and/or at least one electrically insulating layer structure;
an inductor arranged at least partially in the stack, the inductor comprising an electrically conductive coil structure having an interior through hole as a coil opening, and a magnetic core, wherein at least part of the magnetic core at least partially fills the coil opening;
wherein at least part of at least one of the coil structure and the magnetic core is configured as an inlay embedded in the stack;
wherein the magnetic core comprises a plurality of separate magnetic bodies,
wherein the magnetic core is composed of two magnetic sheets and a central magnetic post sandwiched vertically in between, wherein the magnetic post extends through the coil opening and the two magnetic sheets extend laterally beyond the magnetic post and at least partially over the coil structure;
wherein the magnetic bodies are connected to one another so as to form an open magnetic path with at least one non-magnetic gap spacing at least two of the magnetic bodies; and
wherein the at least one non-magnetic gap either comprises an airgap or a gap filled with electrically insulating resin material;
wherein the magnetic bodies, except for the at least two of the magnetic bodies which form the open magnetic path, are connected to one another to form a closed magnetic path and comprise at least one structure of magnetic paste;
wherein an asymmetric arrangement is formed with the magnetic paste between one end of the post and one of the magnetic sheets, and the non-magnetic gap between another end of the post and another one of the magnetic sheets.

2. The component carrier according to claim 1, further comprising at least one of the following features:
wherein at least part of at least one of the coil structure and the magnetic core forms part of the stack;
wherein the coil structure comprises interconnected electrically conductive elements in and/or on a dielectric matrix, wherein the electrically conductive elements comprise planar elements in planes being parallel to one or more planes of the at least one electrically insulating layer structure of the stack and comprise one or more vertical elements connecting the planar elements and extending perpendicular to the planes of the planar elements;
wherein the coil structure has one of a circular ring shape or a rectangular ring shape;
wherein the magnetic core comprises a material having a magnetic permeability of at least 10; or
wherein the magnetic core comprises a ferrite material.

3. The component carrier according to claim 1, wherein a surface of at least part of the magnetic core has a roughness Ra of less than 4 µm.

4. The component carrier according to claim 1, configured as a power converter.

5. The component carrier according to claim 1, configured as a wireless charger for wirelessly charging an electronic apparatus.

6. The component carrier according to claim 1, further comprising:
at least one further inductor arranged at least partially in the stack and comprising a further electrically conductive coil structure, wound around a further coil opening, and a further magnetic core, wherein at least part of the further magnetic core at least partially fills the further coil opening.

7. The component carrier according to claim 6, further comprising at least one of the following features:
wherein at least part of at least one of the further coil structure and the further magnetic core is configured as an inlay embedded in the stack;
wherein the inductor and the at least one further inductor are magnetically coupled;
wherein the inductor and the at least one further inductor are configured as a transformer; or
wherein at least a part of the magnetic cores of the inductor and the at least one further inductor are formed as an integral structure.

8. The component carrier according to claim 1, further comprising at least one component embedded in the component carrier.

9. The component carrier according to claim 8, further comprising at least one of the following features:
wherein the at least one component is embedded in at least one of the group consisting of the stack, the coil structure, and the magnetic core; or
wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

10. The component carrier according to claim 1, further comprising at least one of the following features:
wherein the at least one electrically conductive layer structure comprises at least one of the group consisting of copper, aluminum, nickel, silver, gold, palladium, and tungsten, any of the mentioned materials being optionally coated with supra-conductive material such as graphene;
wherein the at least one electrically insulating layer structure comprises at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;
wherein the component carrier is shaped as a plate;
wherein the component carrier is configured as one of the group consisting of a printed circuit board, and a substrate; or
wherein the component carrier is configured as a laminate-type component carrier.

11. An electric device, comprising:
a support body;
a component carrier mounted on and/or in the support body, the component carrier including a stack having at least one electrically conductive layer structure and/or at least one electrically insulating layer structure;

an inductor arranged at least partially in the stack, the inductor including an electrically conductive coil structure having an interior through hole as a coil opening, and a magnetic core having a plurality of separate magnetic bodies, wherein the magnetic core is composed of two magnetic sheets and a central magnetic post sandwiched vertically in between, wherein the magnetic post extends through the coil opening and the magnetic sheet extends laterally beyond the magnetic post and at least partially over the coil structure, wherein the magnetic bodies are connected to one another so as to form an open magnetic path with at least one non-magnetic gap spacing at least two of the magnetic bodies; and wherein at least part of at least one of the coil structure and the magnetic core is configured as an inlay embedded in the stack;

wherein the at least one non-magnetic gap comprises at least one of the group consisting of an airgap and a gap filled with electrically insulating resin material;

wherein the magnetic bodies, except for the at least two of the magnetic bodies which form the open magnetic path, are connected to one another to form a closed magnetic path and comprise at least one structure of magnetic paste;

wherein an asymmetric arrangement is formed with the magnetic paste between one end of the post and one of the magnetic sheets, and the non-magnetic gap between another end of the post and another one of the magnetic sheets.

12. A method of manufacturing a component carrier, the method comprising:

providing a stack comprising at least one electrically conductive layer structure and/or at least one electrically insulating layer structure;

arranging an inductor at least partially in the stack;

forming the inductor with an electrically conductive coil structure having an interior through hole as a coil opening and with a magnetic core having a plurality of separate magnetic bodies, wherein at least part of the magnetic core at least partially fills the coil opening;

wherein at least part of at least one of the coil structure and the magnetic core is configured as an inlay embedded in the stack;

wherein the magnetic core is composed of two magnetic sheets and a central magnetic post sandwiched vertically in between, wherein the magnetic post extends through the coil opening and the two magnetic sheets extend laterally beyond the magnetic post and at least partially over the coil structure, wherein the magnetic bodies are connected to one another so as to form an open magnetic path with at least one non-magnetic gap spacing at least two of the magnetic bodies; and embedding at least part of at least one of the coil structure and the magnetic core as an inlay in the stack;

wherein the at least one non-magnetic gap comprises an airgap or a gap filled with electrically insulating resin material;

wherein the magnetic bodies, except for the at least two of the magnetic bodies which form the open magnetic path, are connected to one another to form a closed magnetic path and comprise at least one structure of magnetic paste;

wherein an asymmetric arrangement is formed with the magnetic paste between one end of the post and one of the magnetic sheets, and the non-magnetic gap between another end of the post and another one of the magnetic sheets.

13. The method according to claim 12, wherein the method further comprises:

forming at least part of the magnetic core by laser cutting a magnetic body.

\* \* \* \* \*